SEMICONDUCTOR SWITCHING CIRCUITS

Filed Dec. 21, 1959

3 Sheets-Sheet 1

INVENTORS
GORDON W. NEFF
HANNON S. YOURKE

BY,

ATTORNEY

United States Patent Office 3,303,350
Patented Feb. 7, 1967

3,303,350
SEMICONDUCTOR SWITCHING CIRCUITS

Gordon W. Neff, Mahopac, and Hannon S. Yourke, Peekskill, N.Y., assignors to International Business Machines Corporation, New York, N.Y., a corporation of New York Filed Dec. 21, 1959, Ser. No. 860,947
17 Claims. (Cl. 307—88.5)

This invention relates to switching circuits and more particularly to switching circuits employing tunnel diodes in combination with a non-linear load to avoid the necessity of high current sources associated with linear type loads and provide isolation.

An article in the Physical Review for January 1957, on pages 603–604, entitled, "New Phenomenon in Narrow Germanium P–N Junctions," by Lao Esaki, describes a semiconductor structure which has come to be known as an "Esaki Diode," sometimes alternately referred to in the literature and herein as a "tunnel diode." As described by Esaki, this diode is a PN junction device in which the junction is very thin, i.e. narrow, in the currently accepted terminology (on the order of 150 Angstrom units or less), and in which the semiconductor materials on both sides of the junction, have high impurity concentrations (of the order of $10^{19}$ net donor or acceptor atoms per cubic centimeter for germanium).

The Esaki diode is characterized by a very low reverse impedance, approaching a short circuit, with a forward potential-current characteristic exhibiting a negative resistance region beginning at a small value of forward potential (on the order of 0.05 volt) and ending at a large forward potential (of the order of 0.2 volt). The potential value of the low potential end of the negative resistance region is very stable with respect to temperature and does not vary over a range of temperatures from a value near zero degrees K. to several hundred degrees K. At potential values outside the limited range described above, forward resistance of the Esaki diode is positive. The Esaki diode is then considered to be a diode exhibiting an n type characteristic curve for a plot of current versus potential. For a more complete understanding of the structure and operational characteristics of the Esaki diode, reference is made to an article appearing in the Proceedings of the IRE, July 1959, pages 1201–1206, entitled, "Tunnel Diodes as High Frequency Devices," by H. S. Sommers, Jr.

The Esaki (or "tunnel") diode may then be said to be a p-n junction diode wherein both the p-region and the n-region contain a very high concentration of their respective impurities resulting in a voltage vs. current characteristic which exhibits a short circuit stable negative resistance region in the forward biased direction.

For presently available germanium Esaki diodes, the voltage range over the extremities of the negative resistance region is in the order of a few tenths of a volt or less. The current range over this same region depends on the diode fabrication and units are available which range from several micro-amperes to several amperes.

When using the Esaki diode in its negative resistance region, maintaining the proper voltage bias across the diode becomes a problem. Even in the case of the lower current diodes the slope of a resistive load line to achieve maximum current change is very steep, being in the order of a few ohms. Biasing the diode with a voltage source requires that the source have an extremely low internal impedance because of the low impedance of the diode. Furthermore, voltage tolerances on the bias would be extremely small.

A solution to this problem is to use a conventional diode in parallel with a current source as a load across the Esaki diode. By conventional diode is meant rectifying devices such as normal forward biased diodes, zener diodes, reverse breakdown diodes, emitter base diodes of transistors, or any device displaying a non-linear voltage vs. current characteristics similar to the above.

With the above loading conditions, the Esaki diode can be biased to operate either monostably or bistably, depending on the shape of the conventional diode *v-i* curve and the magnitude of the current source. Furthermore, if the desired operating points of the circuit in either monostable or bistable operation are designed to occur close to the negative resistance region of the Esaki diode, then the power necessary to initiate switching of the Esaki through its negative resistance region is less than the power switched by the Esaki and an overall power gain is achieved.

Both monostable and bistable operation have application. With the monostable operation various types of self-resetting triggers can be constructed and, as there is power gain available, the Esaki can be used as a pulse amplifier. When used in conjunction with a transistor, low level pulses can be detected and amplified to the normal level of transistor outputs. With bistable operation binary memory functions can be achieved as well as power gain. As the circuits to be discussed exhibit threshold switching, summation or Kirchoff logic can be performed on multiple inputs. This coupled with binary memory makes possible logic systems. The primary advantage of the bias and loading is that of providing isolation of any particular circuit from those it is driving. Of course, when used with transistors, the Esaki diodes can be isolated from each other by the transistors, but in logic systems transistors are expensive and the use of normal diodes to accomplish isolation is attractive from a cost basis.

Accordingly, a variety of applications will be shown and described in detail which exemplify the use of Esaki diodes biased with the emitter base diode of a transistor, with isolation originating from the transistor. Furthermore there is discussed a means of performing logic whereby the Esaki diodes are biased bistably and coupled together with conventional diodes. By the means described, summation logic is performed and unilateral flow of information is accomplished. Again because of the available power gain, multiple outputs are permitted as well as multiple inputs.

The prime object of this invention is therefore to provide novel switching circuits employing tunnel diodes.

Another object of this invention is to provide novel switching circuits employing tunnel diodes coupled to a non-linear load.

Still a further object of this invention is to provide novel self-resetting triggers wherein a tunnel diode is adapted to be operated monostably.

Yet another object of this invention is to provide novel Kirchoff logic switching circuits employing tunnel diodes which are isolated one from the other by a conventional diode whereby unilateral flow of information is accomplished and power gain provided.

The foregoing and other objects, features and advantages of the invention will be apparent from the following more particular description of preferred embodiments of the invention, as illustrated in the accompanying drawings.

In the drawings:

FIG. 1 is an illustration of a typical potential-current characteristic of a tunnel diode.

FIG. 2*a* illustrates the basic embodiment of this invention.

FIG. 2*b* illustrates the potential-current characteristic of the tunnel diode in the embodiment of FIG. 2*a*.

Figure 3:
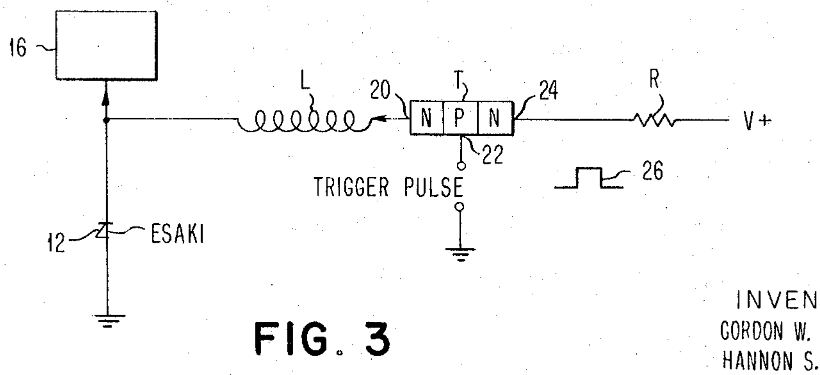
FIG. 3 illustrates an embodiment of this invention.
Figure 5A:
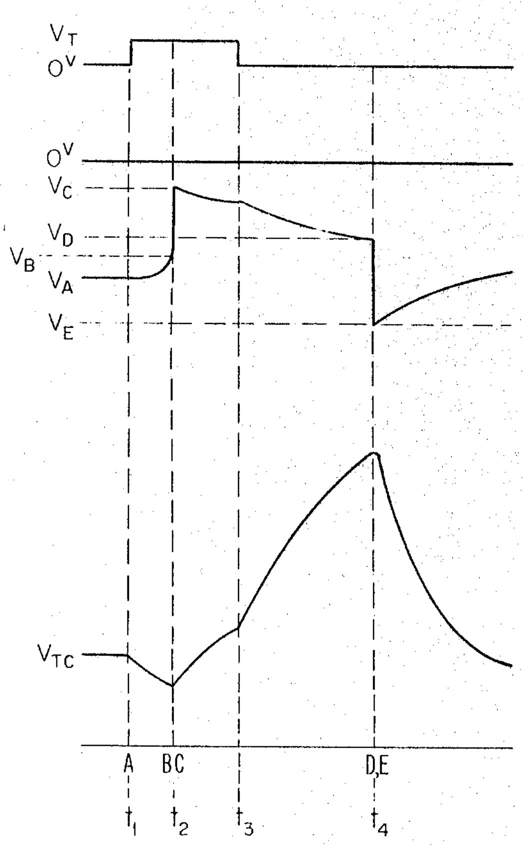
Figure 5B:
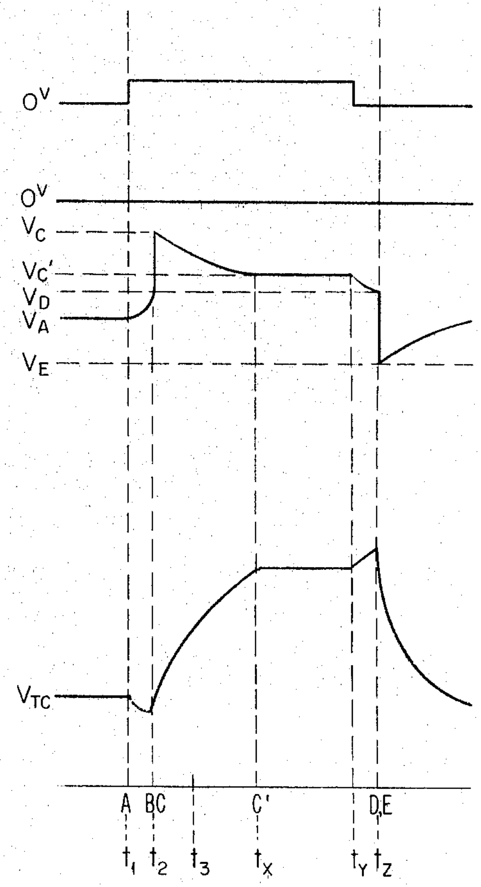

FIGS. 5*a* and 5*b* illustrate the input and output waveforms obtained in operation of the circuit of FIG. 3 according to different modes of operation.

Figure 6:
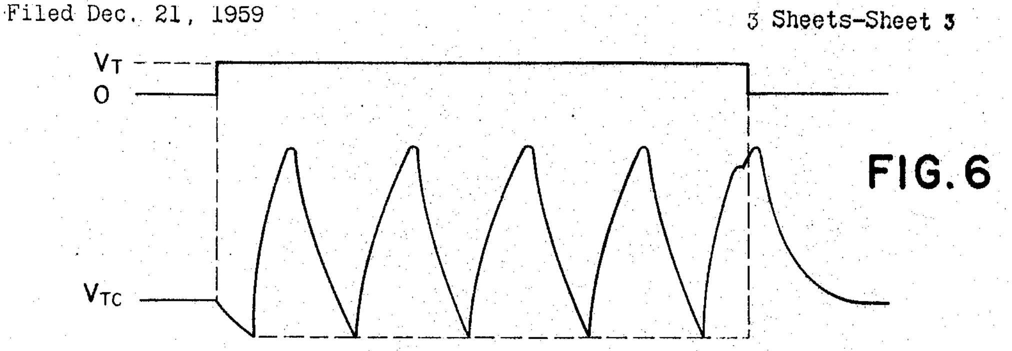

FIG. 6 illustrates another waveform obtained for operation of the embodiment of FIG. 3 in accordance with another mode.

Figure 7:
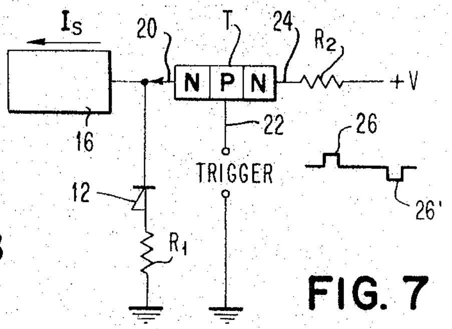

FIG. 7 illustrates another embodiment of this invention.

Figure 8:
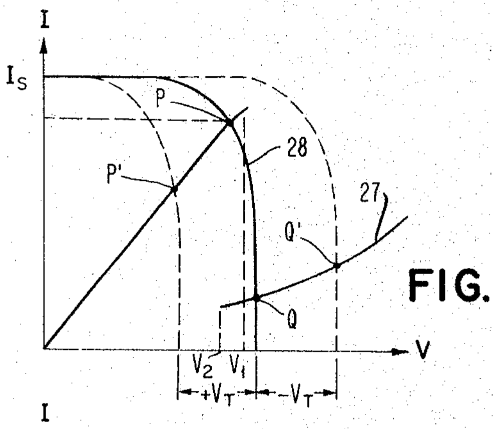

FIG. 8 illustrates the tunnel diode characteristics obtained in operation of the embodiment of FIG. 7.

Figures 9, 10:
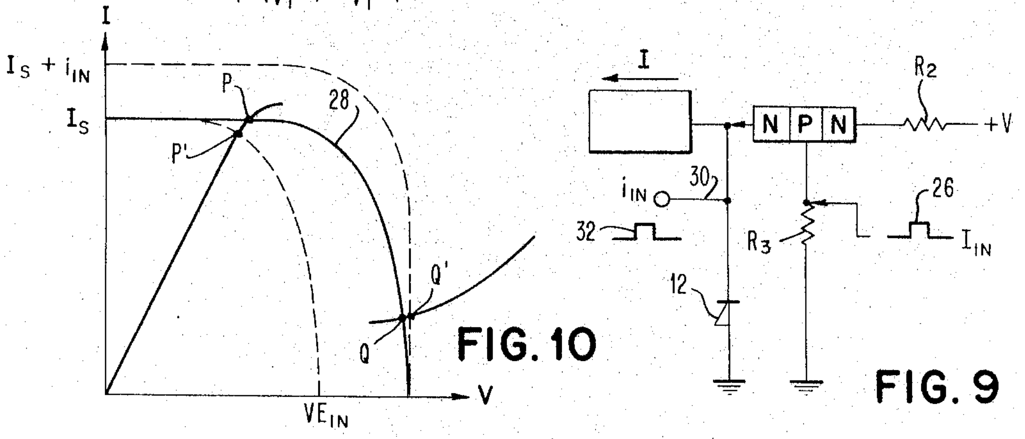

FIG. 9 illustrates another embodiment of this invention.

FIG. 10 illustrates the tunnel diode characteristics obtained in operation of the embodiment of FIG. 9.

Figures 11, 12:
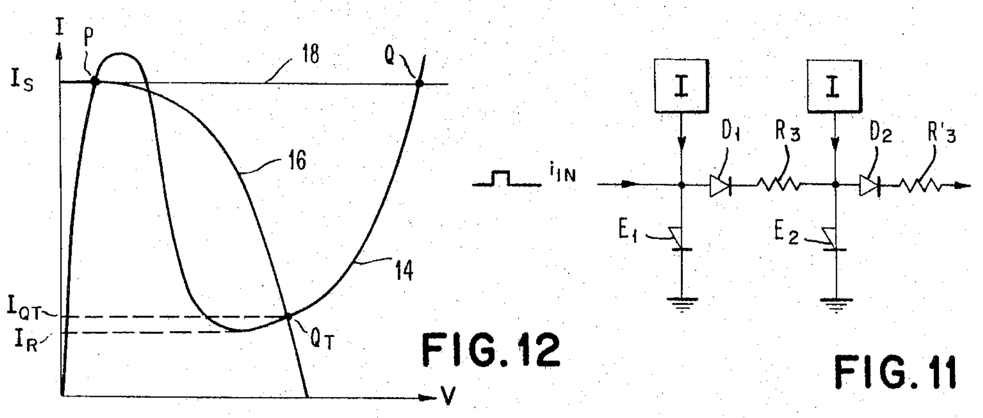

FIG. 11 illustrates still another embodiment of this invention.

FIG. 12 illustrates the tunnel diode characteristics obtained in operation of the embodiment of FIG. 11.

Figure 1:
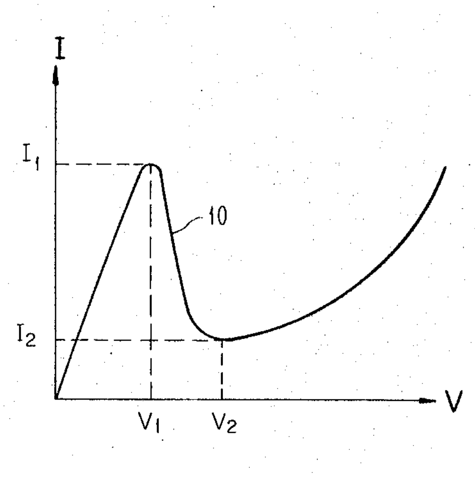

Referring to the FIG. 1, there is shown a curve 10 which is a plot of current I versus potential V for the type Esaki diodes herein employed. As discussed above, the curve 10 illustrates operation of an Esaki diode, providing increasing current for increasing voltage until a first transition region is reached where the current therethrough reaches a value $I_1$ and the voltage thereacross reaches a value $V_1$. Thereafter, there is a sharp drop in current for increasing values of voltage until a second transition region is reached delineated by a current $I_2$ therethrough and a voltage magnitude of $V_2$ thereacross. After the second transition region is reached, for increasing voltage there is experienced increasing magnitudes of current through the Esaki diode. Because the curve 10 resembles the letter n, this type characteristic has been, and is herein considered, an n type characteristic.

Figure 2B:
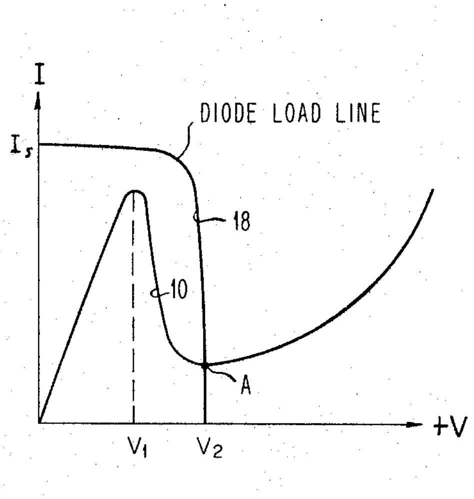
Figure 2A:
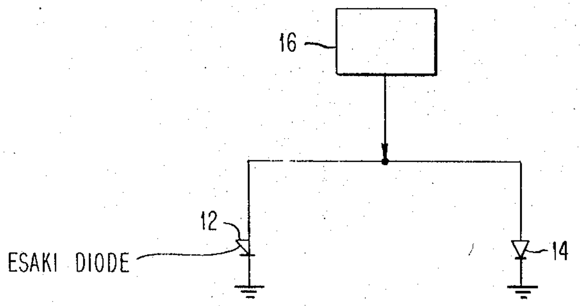

Referring to the FIG. 2*a*, an Esaki diode 12 is provided having a conventional diode 14 connected in parallel therewith and a constant current generator 16 connected to both the diodes 12 and 14. Referring to the FIG. 2*b*, the curve 10 of the FIG. 1 is again shown in a plot of current I versus voltage V for the Esaki diode 12 in the circuit of FIG. 2*a*. In the FIG. 2*b*, a load line 18 is shown as the load across the Esaki 12. A current magnitude I is shown which is equivalent to the current provided by the source 16 in the FIG. 2*a*. With proper choice of the diodes 12 and 14, and the current source 16, it has been found that the load line 18 of the conventional diode 14 can be made to intersect the curve 10 of the Esaki 12 at a low current point near the second transition region described above. As shown the curves 10 and 18 intersect at a point labelled A and this point is also referred to as being near the negative resistance region of the Esaki 12. Thus, by use of a device which exhibits a conventional diode V–I characteristic curve, such as Zener diodes, low voltage reverse breakdown diodes, transistors and the like a smaller current source 16 is needed than would be necessary for a comparable (linear) load line for intersection at point A. By way of example, several embodiments of circuits employing an Esaki diode biased in the manner set forth in the FIGS. 2*a* and 2*b* will be subsequently shown and described in detail wherein the forward biased characteristic of a conventional diode is employed as indicated by the connection shown in FIG. 2*a*. If, however, the reverse breakdown characteristic of a diode is to be employed, the connections as shown for the diode 14 in FIG. 2*a* would be reversed.

Referring to the FIG. 3, a low level pulse amplifier circuit is shown provided with the Esaki diode 12 connected with the constant current generator 16. In series with the generator 16 and in parallel with the Esaki 12 is an inductor L connected to an emitter electrode 20 of an NPN transistor T. The transistor T also provides a base electrode 22 and a collector electrode 24. The emitter 24 of the transistor T is connected to a source of potential V+ through a resistor R.

Figure 4:
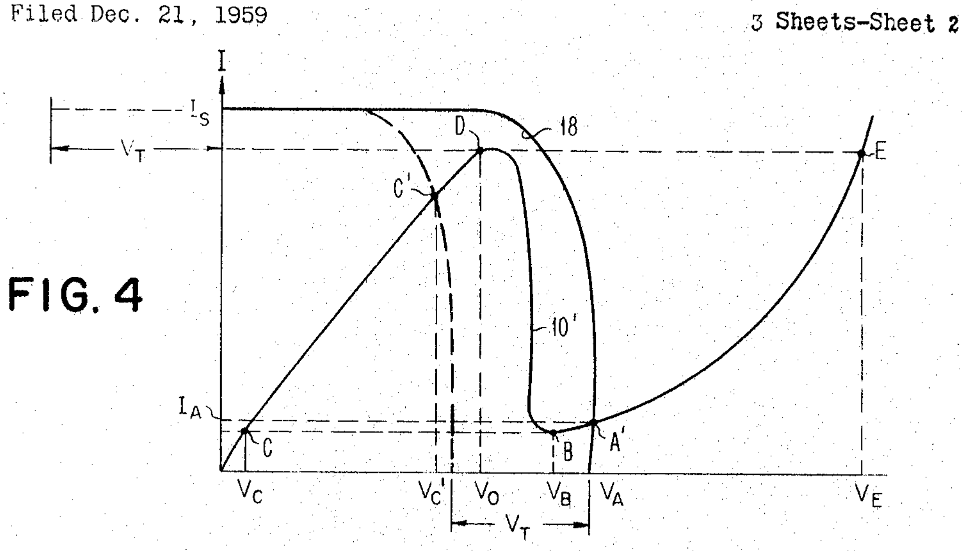
FIG. 4 illustrates the potential-current characteristic of the tunnel diode in the circuit of FIG. 3.

Referring to the FIG. 4, the curve 10 of the Esaki 12 is shown for a plot of current vs. potential. The curve 18 depicting the emitter-base V–I characteristic curve of the transistor T is also shown in the plot with a starting current of $I_s$ on the current axis I of the plot comparable to the current delivered by the source 16. The curves 10 and 18 are shown to intersect at the point A, which is the stable operating point for the Esaki 12 at which point the voltage is $V_A$ and the current is $I_A$. Thus the current flow through the Esaki 12 is $I_A$ and the current into the collector 20 of the transistor T is $I_S - I_A$.

Assume a trigger pulse 26 of amplitude $V_T$ is applied to the base electrode 22 of the transistor T. In effect, the voltage $V_T$ appears across the inductor L which opposes instantaneous change of current through T. As the voltage across the inductor L decays, increased current flows to the transistor T, causing decreased current flow through the Esaki 12. Referring to the FIG. 4, the Esaki 12 moves its operating point from A to a point B on the curve 10, this being the second transition region. This condition is unstable, and as the inductor L will again allow no instantaneous current changes through the Esaki, and the operative point moves to a point C. The ensuing voltage change, $V_B - V_C$ appears across the inductor L. As this voltage decays, the operating point for the Esaki moves along the curve CC′ at a rate determined by the discharge time of the inductor L. If the input pulse is long enough, the operating point of the Esaki 12 will stabilize at the point C′ until the trigger pulse 26 terminates.

Upon termination of the trigger pulse 26, the corresponding voltage change across the inductor L causes increased current flow through the Esaki 12 and in the FIG. 4, causes the operating point thereof to move along the curve 10 to the first transition point labelled D, and thence jump to a point E because the current through L cannot change instantaneously. At point E, the voltage $V_E - V_D$ appears across the inductor L, and as this voltage decays, the current through the Esaki 12 decreases until the stable operating point A is reached.

Referring to the FIGS. 5*a* and 5*b*, the voltage waveforms obtained with reference to the circuit operation described in the FIG. 3 and the curve of FIG. 4 are shown. The FIGS. 5*a* and 5*b* first show a trigger pulse 26 applied to the base 22 of the transistor T in the FIG. 3 to have a duration from a time $t_1$ through a time $t_2$ to a time $t_3$ in the FIG. 5*a* and from a time $t_1$ through $t_2$, $t_3$ and $t_x$ to a time $t_y$ in the FIG. 5*b*. The height of the trigger voltage is labelled $V_T$ and corresponds to the voltage $V_T$ described above and shown in the FIG. 4. As stated above, since circuit operation is considered when the Esaki 12 is operating in its stable operating state A, the corresponding point of operation is shown in the FIGS. 5*a* and 5*b* as describing the circuit at the time $t_1$. Between the time $t_1$–$t_2$, the voltage at the collector 24 of the transistor T decreases, at which time the voltage across the Esaki 12 becomes less negative reaching the voltage $V_C$. Considering operation of the circuit described above, this then follows the operating point of the Esaki 12′ as shown in the FIG. 4 when moving from point A through point B to point C, and as such, the time $t_2$ is also labelled BC to correspond with this operation. (At this point the waveforms in the FIGS. 5*a* and 5*b* differ because of the length of the trigger pulse 26.)

With reference to the FIG. 5*a*, at the time $t_2$, the trigger pulse 26 is still maintained and the voltage across the Esaki 12 moves from $V_C$ toward $V_D$. Before the operating point of the Esaki 12 reaches the point C′ on the curve 10 of the FIG. 4 the trigger pulse 26 terminates at the time $t_3$. Thus, from the time $t_2$ to a time $t_4$, the voltage moves from $V_C$ to $V_D$ at which time an abrupt change takes place corresponding to the transition from point D to the point E of the FIG. 4. Thus the voltage across the Esaki 12′ abruptly changes at the time $t_4$ from $V_D$ to $V_E$, which time is also labelled D, E for clarity. Thereafter, the voltage across the Esaki 12 approaches the stable operating state $V_A$. The collector voltage is seen to rise from the time $t_2$ to the time $t_4$ when increased current flows through the Esaki 12 until the operating point E is reached, thereafter, this voltage decreases to a steady state value for the circuit.

Referring to the FIG. 5*b*, at a time corresponding to the time $t_3$ in the FIG. 5*a*, the trigger pulse 26 is still applied and the potential across the Esaki 12 moves from $V_C$ to $V_C'$ at a time $t_x$ and remains at this operating state until a time $t_y$ when the pulse 26 terminates. It should be noted however, that the collector voltage of the transistor T similarly becomes steady from the time $t_x$ to the time $t_y$. When the pulse 26 terminates, the voltage across the Esaki 12 moves from $V_C'$ toward $V_D$. At a time $t_z$ the voltage $V_D$ is reached and the same abrupt change as shown in the FIG. 5*a* takes place, with the voltage across the Esaki 12' changing from $V_D$ to $V_E$. This time, $t_z$, is also labelled D, E, for clarity and comparison to the plot of FIG. 4.

Triggering levels for the circuit of FIG. 3 must then be only of sufficient magnitude to drive the operating point of the Esaki 12 from point A to point B. Therefore, by adjusting the intersection of the Esaki characteristic curve with the emitter-base diode characteristics of the transistor T as shown by the curve 18, the amplifier can be made to trigger at very low levels.

Another mode of operation for the circuit of FIG. 3 is provided by applying a trigger pulse 26 of sufficient magnitude to overcome the voltage $V_A - V_B$, as shown in FIG. 4, but which is of a magnitude less than the voltage $V_A - V_D$. If the trigger pulse 26 having this magnitude and also having a pulse width greater than the period of one oscillation of the circuit of FIG. 3, this circuit is made to operate as an oscillator. Thus if a trigger pulse 26 were applied to the circuit of FIG. 3 as set forth, the operating point in the FIG. 4 moves from A–B–C–D–E–A. Since the trigger pulse 26 is still present, another circuit oscillation is initiated. The period of the circuit oscillation is dependent upon the decay period of the inductor L in the regions A to B, C to D, and E to A. Therefore, the parameter L of the circuit determines the frequency of operation. The input and output waveforms for this type operation are shown in the FIG. 6.

Referring to the FIG. 6, a trigger pulse 26 applied to the base 22 of the transistor T in the FIG. 3 is shown and labelled $V_t$, having a magnitude sufficient to overcome the voltage $V_A - V_B$ but less than the voltage $V_A - V_D$ as shown in the FIG. 4. The duration of the pulse 26 is chosen to arbitrarily operate the circuit of FIG. 3 over four periods of oscillation, as indicated by a waveform labelled $V_{Tc}$ which is the collector voltage waveform of the transistor T obtained over the period in which the trigger pulse 26 is applied. As is observed, the voltage $V_{Tc}$ takes a sharp drop, depicting the change in FIG. 4 from point A' to point B, and then rises to a maximum, the transition of the tunnel diode 12 of the FIG. 3 from point C to point D on the curve 10 of the FIG. 4, and then drops back to a minimum value again. This characteristic wave is repeated for every cycle of operation of the circuit of FIG. 3 until the trigger pulse 26 is terminated, whereupon the voltage $V_{Tc}$ assumes a stable state depicting operation of the diode 12 of the FIG. 3 in the stable operating state. Furthermore, if $V_T$ terminates during a particular cycle of operation, that cycle will be completed.

The circuit of FIG. 3 may also be operated as a subharmonic generator by selecting L and the period of the trigger pulse 26 such that the period of the circuit is larger than that of the input. Consider for example that an *n*th trigger pulse 26 is directed in the base 22 of the transistor T which starts switching of the circuit as described above. During the switching process of the circuit, the $(n+1)$th trigger pulse 26 is applied, which has no effect. By the time the $(n+2)$th trigger pulse 26 appears, the circuit of FIG. 3 has relaxed and can be triggered again. This type operation then provides a generator of the second subharmonic. Variation of trigger amplitude and frequency with a corresponding variation in L then allows the circuit to generate any of the desired lower subharmonics.

Referring to the FIG. 7, another embodiment of this invention is shown wherein the tunnel diode 12 is provided having a linear resistance $R_1$ serially connected thereto and the transistor T having a base electrode 22, collector electrode 24, and emitter electrode 20, serially connected with a linear resistance $R_2$. Transistor T and resistance $R_2$ are connected in parallel with the diode 12 and resistor $R_1$. As is noted, the reference numerals employed are similar to those noted for the embodiment of FIG. 3 where possible for clarity and ease of understanding. The circuit of FIG. 7 depicts a load characteristic as is shown in the FIG. 8 for the tunnel diode 12.

Referring to the FIG. 8, a curve 27 for a plot of current I vs. potential V is shown for the tunnel diode 12 of the FIG. 7, with the resistance $R_1$ in series and a load line characteristic 28 which intersects the curve 27 at a point P and a point Q depicting two stable operating states for the tunnel diode 12. It will be noted that the shape of the curve 27 is changed over that of curve 10, FIG. 1, due to the inclusion of the series resistor $R_1$. $R_1$ is chosen such that the negative resistance region of curve 27 turns over upon itself such that the first transition region occurs at a value of potential $V_1$ which is larger than the potential $V_2$ at which the second transition region occurs. As a result, this composite characteristic becomes short circuit bistable in the region between $V_2$ and $V_1$ whereas the curve 10 is short circuit stable in this region. Under these conditions, the current source 16 in FIG. 7 is of a magnitude larger than that of the maximum current at the first transition region of the Esaki 12. Correspondingly, no increase of current bias is necessary in switching the Esaki 12 from its stable point P to its stable point Q and may now be achieved quite simply by voltage type switching. Assuming, in the circuit of FIG. 7, the load characteristic is as depicted by line 28 and a trigger pulse 26 is directed into the base 22 of the transistor T, the diode 12 moves its operating point from Q toward the left until the negative resistance region is reached and switches to a point P' on the curve 27 and remains there until the trigger pulse 26 is terminated, whereupon operating point of the tunnel diode moves from point P' to its stable operating condition P, as shown in the FIG. 8. When a trigger pulse 26' is impressed upon the base 22 of the transistor T, which is of opposite polarity, negative, with respect to the trigger pulse 26, the tunnel diode 12 moves toward the right until the beginning of its negative resistance region and then switches to a point Q' on the curve 27. The diode 12 remains operating at the point Q' until the trigger pulse 26' is terminated, whereupon the diode 12 stabilizes at the point Q. Thus a bistable trigger or device may be constructed, where the bistability is provided by the tunnel diode 12 which is adapted to be operated in either a first or a second stable operating state.

With reference to the FIGS. 9 and 10, a preferred embodiment of a bistable device is shown. The circuit of FIG. 9 is identical with that of FIG. 7 except for the exclusion of the resistor $R_1$ and the inclusion of a resistor $R_3$ in base circuit of the transistor T and of an input line 30 in series with the Esaki 12 and the transistor T. The circuit operation is again best described with reference to the characteristic curve 10 of the diode 12 with its load line 28 as is shown in the FIG. 10. Again the circuit is shown with the diode 12 adapted to be operated in a stable state P and a stable state Q. Under these biasing conditions, the current source magnitude I is less than the maximum current of the first transition region for Esaki 12. Thus, to switch the diode 12 from its P to its Q state, an increase in bias current is necessary. The input line 30 is therefore provided to supply the necessary current input to switch the Esaki 12 from P to Q. Assuming the circuit of FIG. 9 is operating in its low current state Q, a positive voltage trigger pulse 26 is directed into the base 22 of the transistor T which causes the diode 12 to switch the point P′ until the pulse 26 is terminated, whereupon the diode 12 relaxes to its operating point P. Now, a positive current pulse 32 energizes the input line 30 to effectively increase the current source magnitude so that the circuit sees $I_s+i_{in}$, causing the diode 12 to immediately switch to a point Q′ on its curve 28 until the pulse 32 terminates, whereupon the circuit relaxes to the stable operating state Q. Here, then, instead of employing one voltage input of alternately opposite polarities, two inputs, one a positive voltage pulse, and the other a positive current pulse, are employed. An advantage of this type operation as compared with that shown in the FIGS. 7 and 8 is that with the tunnel diode 12 biased into the high current state, essentially no current flows in the transistor T, and therefore the level at this point is not sensitive to variations in transistor characteristics.

It is recognized that the switching process of the Esaki diode biased as herein described is a threshhold phenomenon, the thresholds occurring at those values of current and voltage at which transition between positive and negative resistance occurs in the voltage vs. current characteristic of the diode. With the existence of at least one stable state of operation, there is a unique value of current or voltage necessary to move the operating point from said stable state to a threshold of switching. Therefore, summation (Kirchoff) logic can be performed on multiple inputs to the Esakis biased in said manner. Reference to the circuit of FIG. 9 and the corresponding voltage vs. current characteristic of FIG. 10 shows that in switching from the P to the Q stable operating state, there is an overall current gain through load on the Esaki. As the circuit of FIG. 9 requires a current input to switch from P to Q, and as it has current gain, there is no need of the available power gain in the transistor T. Accordingly, when the circuit of FIG. 9 is used to drive similar circuits, the transistor T can be replaced by a conventional diode (rectifying diodes i.e., forward bias diodes, zener diodes, reverse breakdown diodes) which gives the required loading conditions but provides no power gain. In addition, when such circuits are utilized in current summation logic the inclusion of a resistance in series with the conventional diode and the circuits to be driven, facilitate current limiting such that well defined currents are introduced to the driven circuits.

Referring to the circuit of FIG. 11 there is shown, essentially, a combination of two of the circuits of FIG. 9, with the substitution of a conventional diode D for the transistor T, and a change of function for the resistor $R_3$ in that instead of being used to trigger T, it is now used as a current limiting device to adjust the input to $E_2$. The load on $E_1$ consists in this case of $D_1$, $R_1$, and $E_2$ in series. FIG. 12 illustrates the curve 14 which is the V vs. I characteristic for $E_1$. The diode $E_2$ has an identical V vs. I characteristic. Both are D.C. biased with current sources of magnitude I. Assume, both $E_1$ and $E_2$ in their P states, in which case the diodes $D_1$ and $D_2$ are in a high resistance state and no current flows through $D_1$, $R_1$. With the application of the input $i_{in}$, Esaki $E_1$ is moved to a threshold and will consequently switch through the negative resistance region to the point $Q_t$. $Q_t$ is determined by the combined load line of $D_1$, $R_1$, and $E_2$. Now a current of magnitude $I-I_{Qt}$ flows into $E_2$. If this current exceeds the value of $i_{in}$, $E_2$ will correspondingly switch to its $Q_t$ state. As this time the voltage across $D_1$ is decreased to the extent that $D_1$ is forced back into a region of high resistance and conducts very little current. The operating point of $E_2$ then will move to Q, its second stable operating point. Because of the power gain through $E_1$, it is capable of switching several circuits, each requiring a conventional diode and resistor for coupling. The circuit of FIG. 11 illustrates the property of unilateral flow in that, if $E_2$ is switched to its $Q_t$ state while $E_1$ is in its P state, $D_1$ will be reverse biased and conduct no current, thus isolating $E_1$ from $E_2$. To reset $E_1$ to its P state it is necessary to decrease the current bias I to a level below $I_R$, as shown in the FIG. 12 and then allow the bias level to return to I.

While the invention has been particularly shown and described with reference to preferred embodiments thereof, it will be understood by those skilled in the art that various changes in form and details may be made therein without departing from the spirit and scope of the invention.

What is claimed is:

1. A circuit comprising, a tunnel diode exhibiting a current driven negative resistance current-potential characteristic, an inductor element, a semiconductor element exhibiting a non-linear impedance characteristic having an emitter, base and collector electrodes, means connecting said elements in parallel with said diode, and means for energizing the base electrode of said semiconductor to controllably alter the impedance of said semiconductor.

2. A circuit comprising, a tunnel diode exhibiting a current driven negative resistance current-potential characteristic, an inductor element, a semiconductor element exhibiting a non-linear impedance characteristic, means connecting said elements in parallel with said diode, and means for controllably altering the impedance of said semiconductor element.

3. A circuit comprising, a tunnel diode exhibiting a current driven negative resistance current-potential characteristic, an inductor element, a semiconductor element exhibiting a non-linear impedance characteristic having emitter, base and collector electrodes, means connecting said inductor element in series with the emitter electrode of said semiconductor element and further connecting said elements in parallel with said diode, means energizing said base electrode for altering to cause the impedance of said semiconductor element.

4. In a circuit, a plurality of stages each stage comprising a tunnel diode element adapted to be operated in a first and a second stable state, a non-linear load impedance element connected in parallel with said diode, and a current source for energizing said elements, means connecting the impedance element of one stage with the tunnel diode element of a succeeding stage, and variable information input means for energizing said one stage with a current impulse conjointly with the current source thereof to switch said diode from said first to said second stable state to provide a current input to the diode of said succeeding stage which similarly switches to said second stable state to cause substantially the same potential level to be established across both said tunnel diodes effectively cutting off the current input from said first stage and coacting to provide isolation of said one stage from the succeeding stage after information transfer therebetween.

5. The circuit of claim 4, wherein the impedance of each said stage is serially connected with the tunnel diode of the next succeeding stage.

6. The circuit of claim 5, wherein the impedance of each said stage includes a conventional diode.

7. A bistable circuit comprising, in combination, a transistor having base, emitter, and collector electrodes; means for applying operating voltages to the transistor; a tunnel diode connected in parallel with the base-to-emitter diode of the transistor; and means for switching the tunnel diode from one stable state to the other.

8. A monostable circuit comprising, in combination, a transistor having base, emitter, and collector electrodes; means for applying operating voltages to the transistor; a tunnel diode connected in parallel with the base-to-emitter diode of the transistor; means connected to the tunnel diode for quiescently biasing the tunnel diode to one of its positive resistance operating regions; and a source of input pulses connected to the tunnel diode for switching the diode to its other positive resistance operating region.

9. A bistable circuit comprising, in combination, a transistor having base, emitter and collector electrodes; means for applying operating voltages to the transistor; a tunnel diode connected in parallel with the base-to-emitter diode of the transistor; a constant current source connected to the parallel circuit of said tunnel diode and base-to-emitter diode for applying a forward current to the tunnel diode and a bias to the base-to-emitter diode; and means for applying alternate positive and negative pulses to the circuit for switching the diode from one stable state to the other.

10. The combination comprising a transistor having a base electrode and two other electrodes; a negative resistance diode connected between said base electrode and one of said other eletcrodes; means for supplying an operating voltage to the transistor; means biasing said diode for operating as a bistable device; and means for switching said diode alternately between its two stable states.

11. In combination, a transistor having emitter, collector and base electrodes; a tunnel diode connected between the base and emitter electrodes of the transistor; connections for applying an operating voltage to the transistor; and connections for applying input pulses to the transistor.

12. In combination, a transistor having a collector, and a base-to-emitter diode; a tunnel diode connected in parallel with said emitter-to-base diode, like electrode to like electrode; connections for applying an operating voltage to the collector of said transistor; and connecions for applying an input pulse to the base of said transistor.

13. In combination, a transistor having emitter, collector and base electrodes; connections for applying an operating voltage between said emitter and collector electrodes; a tunnel diode connected in parallel with said emitter and base electrodes; means for quiescently biasing said tunnel diode in the higher current region of its low voltage state; and means for applying an input pulse to said tunnel diode for switching the tunnel diode to the lower current region of its high voltage state.

14. In the combination as set forth in claim 13, said biasing means comprising a substantially constant current source.

15. In combination, a transistor having emitter, collector and base electrodes; connections for applying an operating voltage between said emitter and collector electrodes; a tunnel diode connected in parallel with said emitter and base electrodes; means for biasing the tunnel diode in one of the high current region of its low voltage state or the low current region of its high voltage state; and means for applying input pulses to said tunnel diode for switching the tunnel diode between said two states.

16. In a circuit comprising a tunnel diode exhibiting a potential-current characteristic defining a first region of positive resistance over a low range of potentials and adjoining at a peak current value a second region negative resistance and thence a third region of positive resistance, a transistor connected in parallel with said diode exhibiting a non-linear impedance characteristic including a relatively constant value of resistance for a predetermined range of potential and a current source for energizing said circuit effective to cause intersection of said characteristics in the first and third regions of said diode characteristic.

17. In a circuit comprising a tunnel diode exhibiting a potential-current characteristic defining a first region of positive resistance over a low range of potentials and adjoining at a peak current value a second region of negative resistance and thence a third region of positive resistance, load means connected in parallel with said diode exhibiting a non-linear impedance characteristic including a relatively constant value of resistance for a predetermined range of potential and a current source for energizing said circuit effective to cause intersection of said characteristics in the first and third regions of said diode characteristic; said load means including a diode which exhibits only a positive resistance that is connected in series with another tunnel diode.

References Cited by the Examiner

Hunter "Handbook of Semiconductor Electronics," McGraw-Hill Book Co., 1956; pp. 3–16, 17 relied on.

ARTHUR GAUSS, *Primary Examiner.*

GEORGE WESTBY, HERMAN KARL SAALBACH, *Examiners.*

E. N. SPITHAS, J. BUSCH, *Assistant Examiners.*